(12) United States Patent  
Weber

(10) Patent No.: US 7,435,691 B2  
(45) Date of Patent: Oct. 14, 2008

(54) MICROMECHANICAL COMPONENT AND SUITABLE METHOD FOR ITS MANUFACTURE

(75) Inventor: Heribert Weber, Nuertingen (DE)

(73) Assignee: Robert Bosch GmbH, Stuttgart (DE)

( * ) Notice: Subject to any disclaimer, the term of this patent is extended or adjusted under 35 U.S.C. 154(b) by 461 days.

(21) Appl. No.: 11/221,520

(22) Filed: Sep. 7, 2005

(65) Prior Publication Data

US 2006/0057755 A1    Mar. 16, 2006

(30) Foreign Application Priority Data

Sep. 14, 2004   (DE)   ........................ 10 2004 044 222

(51) Int. Cl.  
*H01L 21/31* (2006.01)  
*H01L 21/469* (2006.01)

(52) U.S. Cl. ........................ 438/770; 438/637; 438/680; 257/E21.17; 257/E21.222; 257/E21.132; 257/E21.249; 257/E21.278

(58) Field of Classification Search ............... 438/8, 438/637, 680, 689, 723, 724, 744, 745, 756, 438/757, 770, 775  
See application file for complete search history.

(56) References Cited

U.S. PATENT DOCUMENTS

| | | | | |
|---|---|---|---|---|
| 5,175,123 A | * | 12/1992 | Vasquez et al. | 438/689 |
| 5,229,318 A | * | 7/1993 | Straboni et al. | 438/445 |
| 5,318,922 A | * | 6/1994 | Lim et al. | 438/448 |
| 5,393,692 A | * | 2/1995 | Wu | 438/446 |
| 5,399,520 A | * | 3/1995 | Jang | 438/445 |
| 5,789,305 A | * | 8/1998 | Peidous | 438/439 |
| 5,994,203 A | * | 11/1999 | Mathews | 438/448 |
| 6,245,643 B1 | * | 6/2001 | King et al. | 438/439 |

* cited by examiner

*Primary Examiner*—David Nhu  
(74) *Attorney, Agent, or Firm*—Kenyon & Kenyon LLP

(57) ABSTRACT

A micromechanical component having a silicon substrate; a cavity provided in the substrate; and a diaphragm, provided on the surface of the substrate, which closes the cavity; the diaphragm featuring a silicon-oxide layer having an opening that is formed by silicon-oxide wedges pointing to each other; and the diaphragm having at least one closing layer which closes the opening. Also, a suitable manufacturing method.

6 Claims, 3 Drawing Sheets

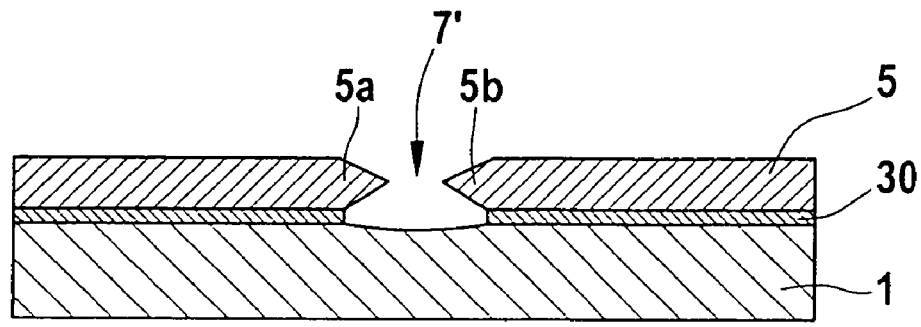
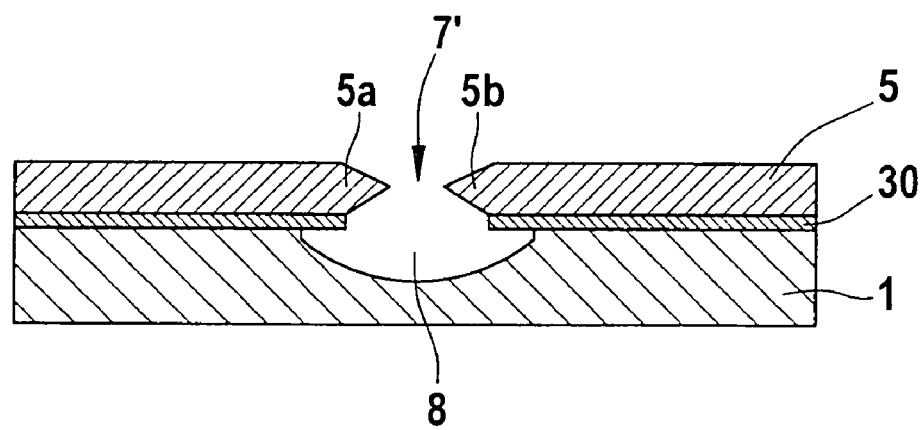
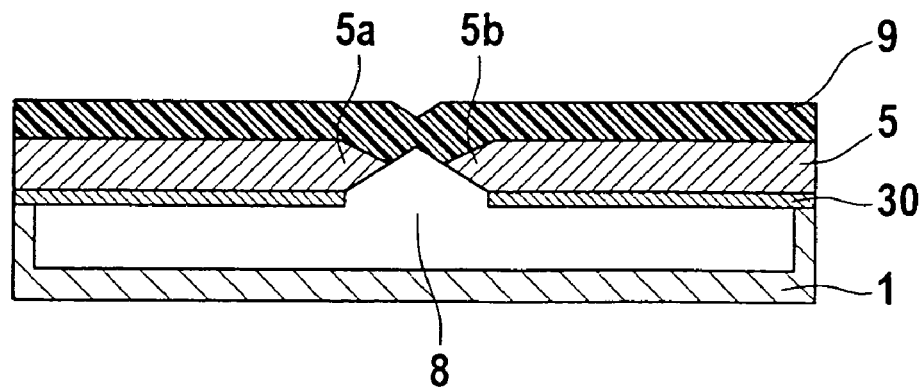

MICROMECHANICAL COMPONENT AND SUITABLE METHOD FOR ITS MANUFACTURE

BACKGROUND INFORMATION

In manufacturing diaphragm sensors using surface micromechanics, it is necessary when providing thermally insulated diaphragms, to remove the silicon below the diaphragms. As a rule, this is accomplished through access openings in the diaphragm layer, through which the silicon below it is removed by $ClF_3$ etching, for example. To prevent dirt, moisture or other foreign matter from depositing between the diaphragm and the silicon substrate, or to be able to set a differential pressure between the front side and the back side of the diaphragm, these access openings must be closed again after the etching process. However, because of the large opening diameters attainable using standard methods, the closing of the access openings calls for thick closing layers.

In principle, this problem can be met by small access openings having a diameter <500 nm, as can be realized, for example, by stepper exposure in photoresist. However, the stepper necessary for this demands a large capital outlay. In transferring the photoresist structure into, for example, an oxide layer, however, the structure is enlarged, and therefore the hole diameter becomes larger. In the best case, the smallest hole diameter is identical to the structure realized in the photoresist layer.

SUMMARY OF THE INVENTION

The micromechanical component of the present invention and the manufacturing methods according to the present invention have the advantage of allowing simple manufacturability of the smallest access openings.

An idea underlying the present invention is to implement access openings for an etching process in a silicon substrate in such a way that, with the aid of an oxidation mask, non-oxidized silicon regions are created in a silicon-oxide layer whose diameters can be set by the duration of the thermal oxidation. Thus, etch openings in the submicrometer range can be produced in a very simple manner.

The subject matter of the present invention may be used, for example, for all sensors which need good thermal insulation with respect to the silicon substrate. For instance, mass air-flow sensors, thermopiles, gas sensors, etc., may be mentioned here.

According to one preferred embodiment, the closing layer is made of silicon oxide. The closing layer may preferably be formed from deposited polysilicon, which may optionally be converted into a silicon oxide by thermal oxidation.

According to another preferred embodiment, below the silicon-oxide layer, an oxidation stop layer is provided that is interrupted in the region of the opening.

According to a further preferred development, the oxidation stop layer contains silicon nitride and/or silicon carbide.

BRIEF DESCRIPTION OF THE DRAWINGS

FIGS. 2a-2g show schematic cross-sectional views of the manufacturing steps of a micromechanical component according to a second specific embodiment of the present invention.

DETAILED DESCRIPTION

Figure 1A:
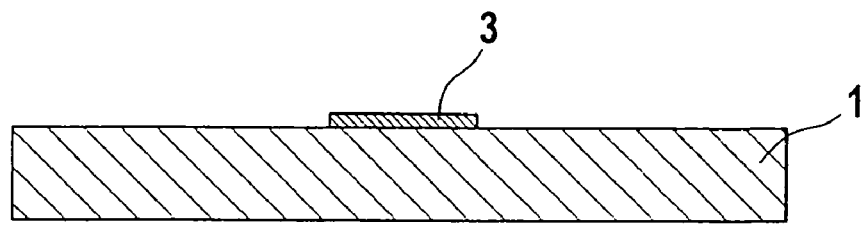
FIGS. 1a-1d show schematic cross-sectional views of the manufacturing steps of a micromechanical component according to a first specific embodiment of the present invention.

In the figures, components which are the same or functionally equivalent are denoted by the same reference numerals.

FIGS. 1a-1d show schematic cross-sectional views of the important manufacturing steps of a micromechanical component according to a first specific embodiment of the present invention.

In FIG. 1a, reference numeral 1 denotes a silicon substrate. Optionally, a thin, thermal silicon-oxide layer (not shown) may be applied on the upper side of silicon substrate 1. Reference numeral 3 in FIG. 1a denotes an oxidation mask that has been produced by depositing and patterning an LPCVD (low-pressure chemical vapor deposition) silicon-nitride layer.

Figure 1B:
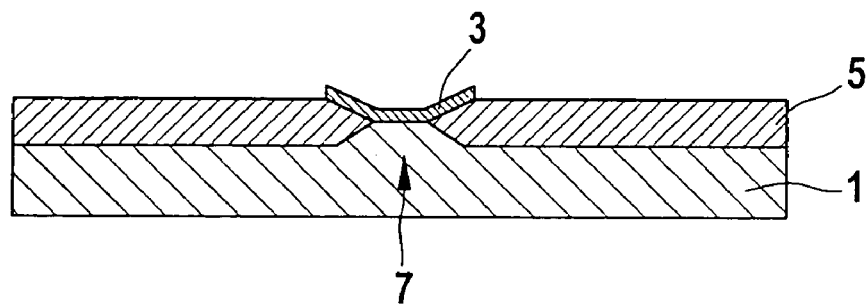

With reference to FIG. 1b, after forming oxidation mask 3, the upper side of the silicon substrate is thermally oxidized using oxidation mask 3. In so doing, a silicon-oxide layer 5, extending below oxidation mask 3, forms on the upper side of the silicon substrate; below oxidation mask 3, silicon-oxide layer 5 has a non-oxidized silicon region 7 that is bounded by silicon-oxide wedges 5a, 5b pointing to each other. In this process step, oxidation mask 3 curves upward at its edges corresponding to the shape of silicon-oxide wedges 5a, 5b. Silicon-oxide wedges 5a, 5b are also known as "bird's beak." By way of the oxidation time, it is possible to adjust how far silicon-oxide wedges 5a, 5b are able to grow below oxidation mask 3, and accordingly, how large non-oxidized silicon region 7 is.

Figure 1C:
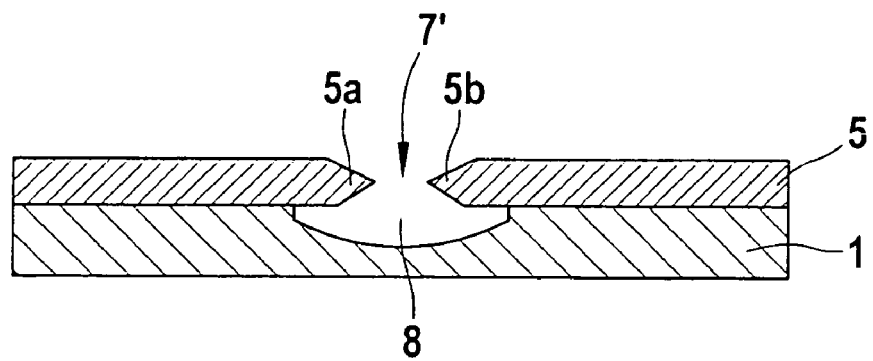

Continuing with reference to FIG. 1c, in a subsequent process step, silicon-nitride oxidation mask 3 is removed, e.g., by a selective wet-etch process, expediently using hot phosphoric acid. After removal of oxidation mask 3, and given suitable adjustment of the oxidation period, a non-oxidized silicon region 7 is obtained which may have a diameter in the submicrometer range.

Figure 1D:
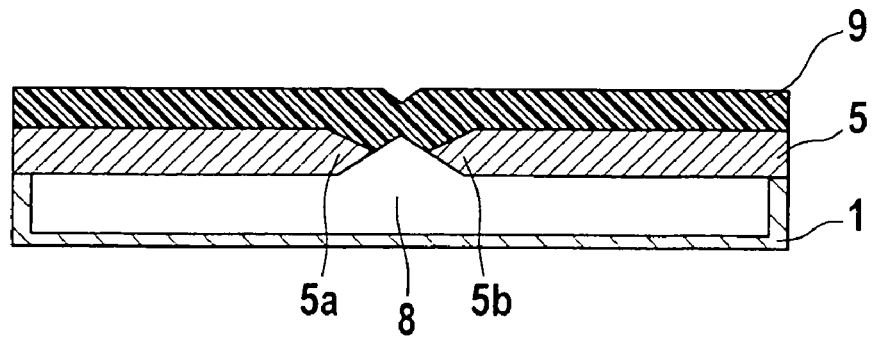

Non-oxidized silicon region 7 is used in a further process step, which is likewise illustrated in FIG. 1c, as access for an etchant to the silicon substrate. By this etching process, a cavity 8 may be formed in silicon substrate 1, as shown in FIG. 1c and FIG. 1d. Silicon substrate 1 is preferably etched using $ClF_3$.

After silicon substrate 1 has been etched, opening 7' in silicon-oxide layer 5 may easily be closed, e.g., by depositing a PECVD (plasma-enhanced chemical vapor deposition) silicon-oxide layer 9.

An alternative for producing such a closing layer is to deposit and subsequently optionally oxidize a silicon layer to a higher valency. This alternative has the additional advantage that a diaphragm layer structure is obtained whose stress no longer changes in response to further high-temperature steps.

The resulting oxide thickness when producing opening 7' is a function of the dimensioning of silicon-nitride oxidation mask 3 and the desired size of non-oxidized silicon region 7 below oxidation mask 3. The size of the non-oxidized region may be set in the submicrometer range by this technique.

FIGS. 2a-2g show schematic cross-sectional views of the important manufacturing steps of a micromechanical component according to a second specific embodiment of the present invention.

In the second specific embodiment described below, the oxide thickness of oxide layer 5 may be specified in advance, and is no longer a function of the factors named in connection with the first specific embodiment.

Figure 2A:
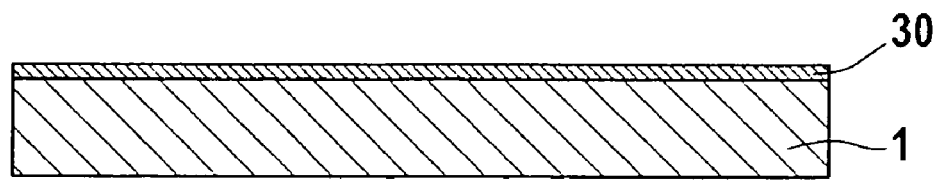
Figure 2B:
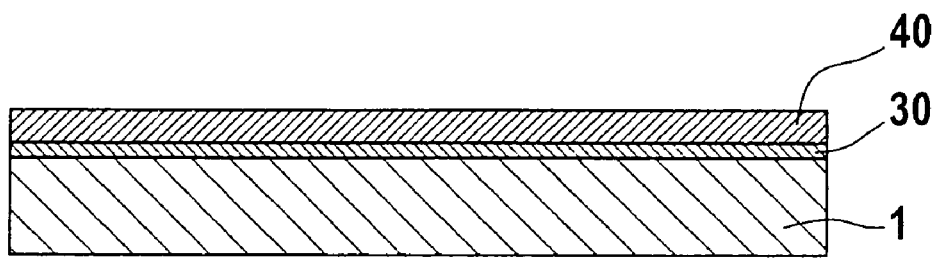

With reference to FIG. 2a, first of all, a thin, thermal silicon-oxide layer (not shown) is optionally formed over a silicon substrate 1. An LPCVD silicon-nitride layer 30, which later is supposed to function as an oxidation stop layer, is then deposited on the upper side of silicon substrate 1. A polycrystalline silicon layer 40, as shown in FIG. 2b, is subsequently deposited onto this silicon-nitride layer 30. Optionally, a thin, thermal silicon-oxide layer may likewise be formed on polysilicon layer 40 prior to forming oxidation mask 3'.

Figure 2C:
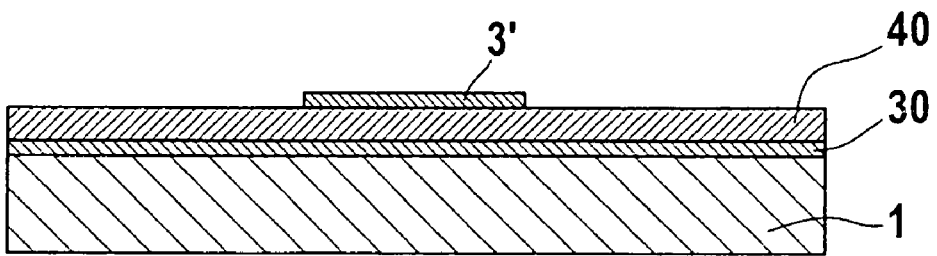

Continuing with reference to FIG. 2c, oxidation mask 3' is subsequently formed on polysilicon layer 40, analogously to the first specific embodiment described above.

Figure 2D:
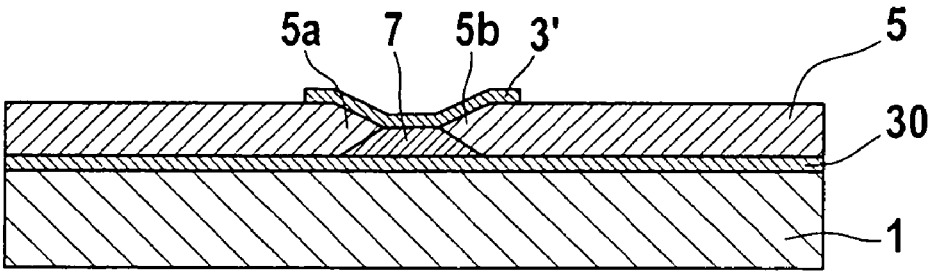

As FIG. 2d shows, entire polysilicon layer 40 is subsequently thermally oxidized, using oxidation mask 3'. In so doing, polysilicon layer 40 is converted into a silicon-oxide layer 5 which extends below oxidation mask 3' and which, below oxidation mask 3', has a non-oxidized silicon region 7 that is bounded by silicon-oxide wedges 5a, 5b pointing to each other. Silicon-nitride layer 30, functioning as an oxidation stop layer, separates polysilicon layer 40 from silicon substrate 1 and prevents silicon-oxide layer 5 from increasing ever more in thickness as the oxidation period increases. Thus, silicon-oxide thickness 5 attainable on silicon-nitride layer 30 is dependent only on the thickness of polysilicon layer 40.

In the process state shown in FIG. 2d, non-oxidized silicon region 7 of polysilicon layer 40 below oxidation mask 3' is depicted.

To expose opening 7', according to FIG. 2e, oxidation mask 3', non-oxidized silicon region 7 of polysilicon layer 40 and silicon-nitride oxidation stop layer 30 are removed one after another, in order to reach the upper side of the silicon substrate.

Then, as in the first specific embodiment, a cavity 8 is provided in silicon substrate 1 by an etching process; as shown in FIG. 2f and FIG. 2g, opening 7' serves as access for the etchant to silicon substrate 1.

Finally, with reference to FIG. 2g, a PECVD oxide layer 9 is deposited for closing opening 7', and therefore cavity 8.

In the second specific embodiment, openings 7' yield etch accesses whose smallest cross-section is given by the tips of symmetrical silicon-oxide wedges 5a, 5b facing opposite each other. As already mentioned, the maximum produced thickness of silicon-oxide layer 5 is dependent only on the thickness of polysilicon layer 40 and not on the time factor of the thermal oxidation. Moreover, silicon-nitride layer 30 used as oxidation stop layer may advantageously be used for adjusting the stress of the diaphragm in the final state.

Although the present invention was described above in light of a preferred exemplary embodiment, it is not restricted to it, but is able to be modified in various ways.

Although a PECVD silicon-oxide layer or a polysilicon layer oxidized to a higher valency was used as closing layer in the specific embodiments above, naturally other materials may be used for this purpose. However, the maximum permissible stresses must be an important consideration in the specific practical application.

| Reference Numeral List: | |
| --- | --- |
| 1 | silicon semiconductor substrate |
| 3 | silicon-nitride layer |
| 5 | silicon-oxide layer |
| 5a, 5b | silicon-oxide wedges |
| 7 | non-oxidized silicon region |
| 7' | opening |
| 9 | closing layer |
| 8 | cavity |
| 30 | oxidation stop layer |
| 40 | polycrystalline silicon layer |

What is claimed is:

1. A method for manufacturing a micromechanical component, comprising:
    providing a silicon substrate;
    providing an oxidation stop layer on an upper side of the silicon substrate;
    providing a silicon layer on the oxidation stop layer;
    forming an oxidation mask on an upper side of the silicon layer;
    thermally oxidizing the silicon layer using the oxidation mask, the silicon layer changing into a silicon-oxide layer that extends below the oxidation mask and has, below the oxidation mask, a non-oxidized silicon region that is bounded by silicon-oxide wedges pointing to each other;
    removing the oxidation mask and the non-oxidized silicon region of the silicon layer to expose an opening;
    interrupting the oxidation stop layer in a region of the opening to expose the silicon substrate;
    producing a cavity, situated in the silicon substrate, by an etching process, the opening serving as access for an etchant to the silicon substrate; and
    closing the opening and the cavity by at least one closing layer.

2. The method according to claim 1, wherein a silicon-oxide layer is deposited as the closing layer.

3. The method according to claim 1, wherein a silicon layer is deposited as the closing layer.

4. The method according to claim 1, wherein a silicon layer is deposited as the closing layer and is at least partially oxidized to a higher valency.

5. The method according to claim 1, further comprising, prior to forming the oxidation mask, forming a thermal silicon-oxide layer on the upper side of the silicon substrate.

6. The method according to claim 1, further comprising, prior to forming the oxidation mask, forming a thermal silicon-oxide layer on the upper side of the silicon layer.

* * * * *